US006882532B2

United States Patent
Chen et al.

(10) Patent No.: US 6,882,532 B2
(45) Date of Patent: Apr. 19, 2005

(54) DOUBLE-WINGED RADIATOR FOR CENTRAL PROCESSING UNIT

(75) Inventors: Chih-peng Chen, Taipei (TW); Hsin-cheng Lin, Lujou (TW)

(73) Assignee: Asia Vital Components Co., Ltd., Kaosiung (TW)

( * ) Notice: Subject to any disclaimer, the term of this patent is extended or adjusted under 35 U.S.C. 154(b) by 98 days.

(21) Appl. No.: 10/383,626

(22) Filed: Mar. 10, 2003

(65) Prior Publication Data

US 2004/0179335 A1 Sep. 16, 2004

(51) Int. Cl.$^7$ .................................................. H05K 7/20
(52) U.S. Cl. ................. 361/690; 165/80.3; 165/104.33; 165/185; 174/15.2; 257/722; 361/700; 361/703; 361/704
(58) Field of Search ............................... 165/80.3–80.4, 165/185, 104.33; 174/15.2; 257/714–716, 722; 361/687–690, 700–704, 707–710, 697

(56) References Cited

U.S. PATENT DOCUMENTS 6,487,076 B1 * 11/2002 Wang .......................... 361/697
6,712,129 B1 * 3/2004 Lee ........................ 165/104.21

* cited by examiner

*Primary Examiner*—Gregory Thompson
(74) *Attorney, Agent, or Firm*—Bacon & Thomas, PLLC

(57) ABSTRACT

A double-winged radiator for central processing unit (CPU) includes a heat-transfer block mounted on a top of a CPU that produces a large amount of heat during an operation thereof, and two sets of first radiator fins fixed to two outer ends of at least one heat-transfer tube that is seated on a top of the heat-transfer block. The heat produced by the CPU and transferred to the heat-transfer block is further transferred via the heat-transfer tube to the two sets of first radiator fins that provide large radiating area and high radiating efficiency to allow quick dissipation of heat therefrom. A locating member may be mounted on and between the two sets of first radiator fins to protect the latter from deformation under pressure. One set of second radiator fins may be mounted between the two sets of first radiator fins to provide increased radiating area and efficiency.

6 Claims, 5 Drawing Sheets ously connected to the cylindrical heat-transfer tube. The heat-transfer tube is provided at a proximal end with an extension, on which fixing means are mounted for fixedly connecting the heat-transfer plate to the chip, and at a distal end with radiating fins. That makes the conventional radiating means look like having a wing. While the above-described radiating means uses the heat-transfer tube connected to the heat-transfer plate to increase the radiating speed, the heat-transfer plate itself is a means for transferring heat from a heat source to the heat-transfer tube and has only limited radiating capacity. The heat dissipates mainly from the radiating fins connected to the distal end of the heat-transfer tube. Thus, the radiating means disclosed in U.S. Pat. No. 5,549,155 is apparently insufficient in its overall radiating capacity.

DOUBLE-WINGED RADIATOR FOR CENTRAL PROCESSING UNIT

FIELD OF THE INVENTION

The present invention relates to a double-winged radiator for central processing unit (CPU) including a heat-transfer block made of a material having a high heat transfer capacity for mounting on a top of a CPU that produces a large amount of heat during an operation thereof, and two sets of radiator fins made of a material having a high heat transfer capacity for fixing to two outer ends of at least one heat-transfer tube that has a middle section seated on a top of the heat-transfer block. The heat produced by the CPU and transferred to the heat-transfer block is further transferred via the heat-transfer tube to the two sets of radiator fins that provide large radiating area and high radiating efficiency to allow quick dissipation of heat therefrom.

BACKGROUND OF THE INVENTION

It has been a common concern among manufacturers and users of electronic components for computer about ways for effectively reducing and dissipating heat produced by the electronic components in a computer during their operations. When an operating speed of a CPU of the computer increases, heat produced by the CPU during the operation thereof also largely increases. It is always an important issue in designing radiating elements to effectively dissipate the heat produced by the CPU during operation thereof, in order to lower a temperature of the CPU for the same to maintain a normal operation at an intended high operating speed.

FIGS. 1 and 2 shows a general radiator 11 for a CPU 12. The general radiator 11 is typically made of an aluminum material for directly mounting on a top of the CPU 12. The radiator 11 includes a plurality of radiating fins having a large radiating area each to enable quick dissipation of heat therefrom. However, such radiator 11 requires high manufacturing cost and occupies a large space.

U.S. Pat. No. 5,549,155 discloses a radiating means for use with a chip in an integrated circuit (IC). The radiating means includes a heat-transfer plate that is in contact with an upper surface of the chip and connected to a heat-transfer tube to dissipate heat produced by the chip and transferred to the heat-transfer plate. One of two sides of the heat-transfer plate is a flat surface that is in contact with the chip, and the other side is connected to the cylindrical heat-transfer tube. The heat-transfer tube is provided at a proximal end with an extension, on which fixing means are mounted for fixedly connecting the heat-transfer plate to the chip, and at a distal end with radiating fins. That makes the conventional radiating means look like having a wing. While the above-described radiating means uses the heat-transfer tube connected to the heat-transfer plate to increase the radiating speed, the heat-transfer plate itself is a means for transferring heat from a heat source to the heat-transfer tube and has only limited radiating capacity. The heat dissipates mainly from the radiating fins connected to the distal end of the heat-transfer tube. Thus, the radiating means disclosed in U.S. Pat. No. 5,549,155 is apparently insufficient in its overall radiating capacity.

U.S. Pat. No. 6,021,044 discloses a radiating means for carrying away heat produced by electronic elements during operations thereof. The radiating means includes a radiator and a heat-transfer tube. The heat-transfer tube is fixedly connected to the radiator and is provided at an end with a plurality of radiating fins, making it look like having a wing. The radiator has a rectangular profile and includes a bottom surface, a top surface, and a cylindrical channel centered at the top surface. Two sets of radiating fins are separately located on the top surface of the radiator for carrying away heat from the radiator. The heat-transfer tube includes a heat-receiving end fixedly connected to the cylindrical channel of the radiator for maximizing the heat that can be transferred from the radiator to the heat-transfer tube, and a heat-radiating end. Heat transferred to the heat-transfer tube dissipates from the radiating fins fixedly provided at an end of the heat-transfer tube. Since the radiator is directly attached to a CPU of a computer, heat produced by the CPU during operation thereof is transferred to the heat-transfer tube via the radiator, and then to the radiating fins at the end of the heat-transfer tube to dissipate therefrom. The above-described radiating means has increased radiating efficiency. However, it is structurally similar to the radiating means disclosed in U.S. Pat. No. 5,549,155 to improve the radiating efficiency by mounting radiating fins on only one end of the heat-transfer tube.

These radiating means of prior art are, however, not sufficient for use with a CPU that operates faster and produces more heat. Moreover, the radiating means disclosed in U.S. Pat. Nos. 5,549,155 and 6,021,044 are provided at only one end with the radiating fins. To increase the radiating capacity of these conventional radiating means, it is necessary to expand a volume of the radiating fins, which would inevitably cause the radiating means to occupy more space on a main board of the computer, making the radiating means not suitable for computer industry, particularly the notebook computer, which demands for manufacturing of products having volumes as compact as possible.

It is therefore tried by the inventor to develop a double-winged radiator for CPU to eliminate the drawbacks existed in the conventional radiating means for CPU.

SUMMARY OF THE INVENTION

A primary object of the present invention is to provide a double-winged radiator capable of efficiently carrying away heat produced by a CPU during operation thereof.

Another object of the present invention is to provide a double-winged radiator that well utilizes a space above a CPU to provide an increased radiating capacity.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein.

DETAILED DESCRIPTION OF THE PREFERRED EMBODIMENTS

Figure 2:
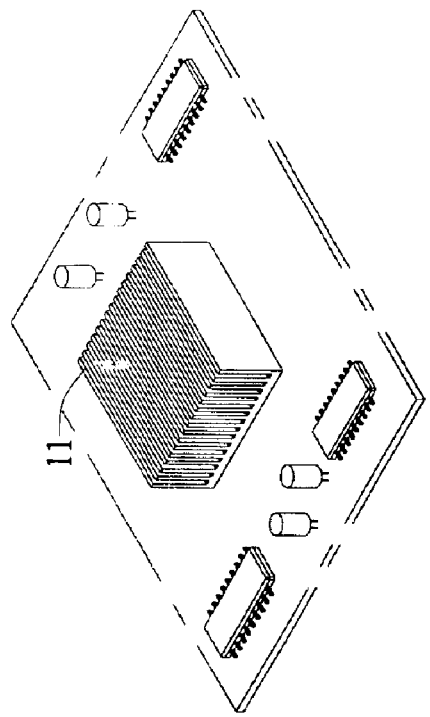
FIG. 2 is an assembled view of FIG. 1.
Figure 1:
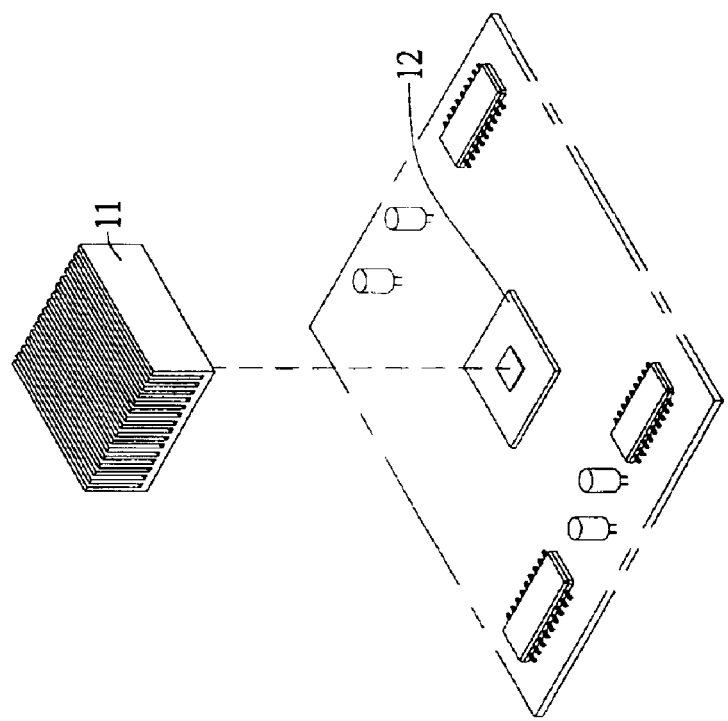
FIG. 1 is an exploded perspective view showing a conventional radiator for CPU before the radiator is mounted to the CPU.
Figure 4:
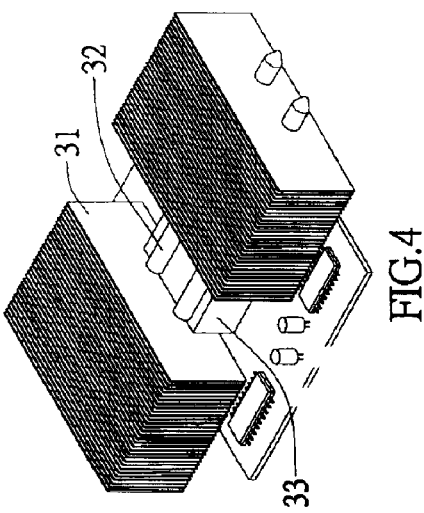
FIG. 4 is an assembled perspective view of FIG. 3.
Figure 3:
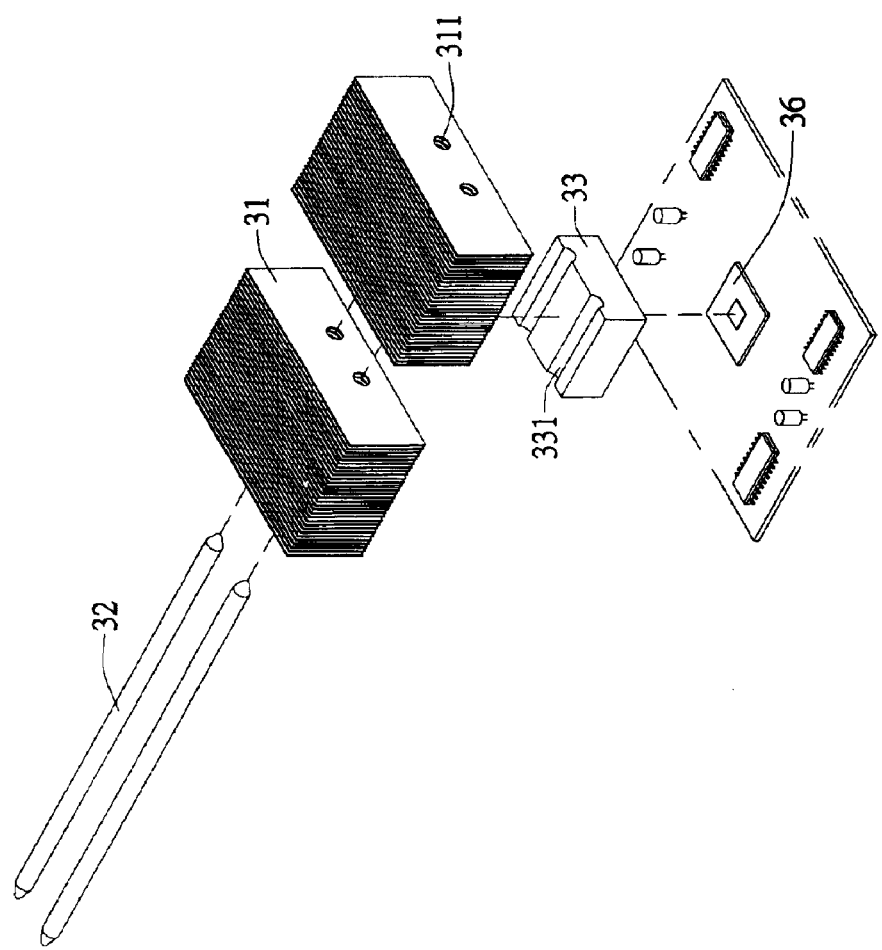
FIG. 3 is an exploded perspective view of a double-winged radiator for CPU according to a first embodiment of the present invention having two sets of first radiating fins.

Please refer to FIGS. 3 and 4 that are exploded and assembled perspective views, respectively, of a double-winged radiator for CPU according to a first embodiment of the present invention. As shown, the double-winged radiator for CPU mainly includes two sets of first radiator fins 31, two heat-transfer tubes 32, and a heat-transfer block 33. The first radiator fins 31 are made of a material having a high heat transfer capacity, and are provided at predetermined positions with two through holes 311 corresponding to the two heat-transfer tubes 32. The heat-transfer block 33 is also made of a material having a high heat transfer capacity, which is preferably a copper material. The heat-transfer block 33 is provided at a predetermined position with a receiving portion 331 in the form of two grooves for the two heat-transfer tubes 32 to locate therein.

The heat-transfer tubes 32 are extended through the two through holes 311 provided on the two sets of first radiator fins 31, such that the two sets of first radiator fins 31 are separately fixed to two outer ends of the heat-transfer tubes 32 and middle sections of the heat-transfer tubes 32 between the two sets of first radiator fins 31 are seated in the two grooves of the receiving portion 331 of the heat-transfer block 33, making the radiator of the present invention look like having two wings.

The heat-transfer block 33 is designed for mounting to an upper side of a central processing unit (CPU) 36. When the heat-transfer block 33 is mounted to the upper side of the CPU 36, heat produced by the CPU 36 during its operation is transferred via the heat-transfer block 33 to the two heat-transfer tubes 32 seated in the receiving portion 331 of the block 33, and then to the first radiator fins 31 fixedly mounted on the two outer ends of the heat-transfer tubes 32, allowing heat produced by the CPU 36 to be radiated via a considerably large radiating area and at an increased speed. Since the first radiating fins 31 are located at two outer ends of the heat-transfer tubes 32, heat produced by the CPU 36 is transmitted to two ends of the heat-transfer tubes 32 and quickly dissipates at the two sets of first radiator fins 31.

It is understood the number of the heat-transfer tubes 32 is not limited to two but may be increased to enhance a radiating efficiency of the radiator of the present invention.

Figures 5, 6:
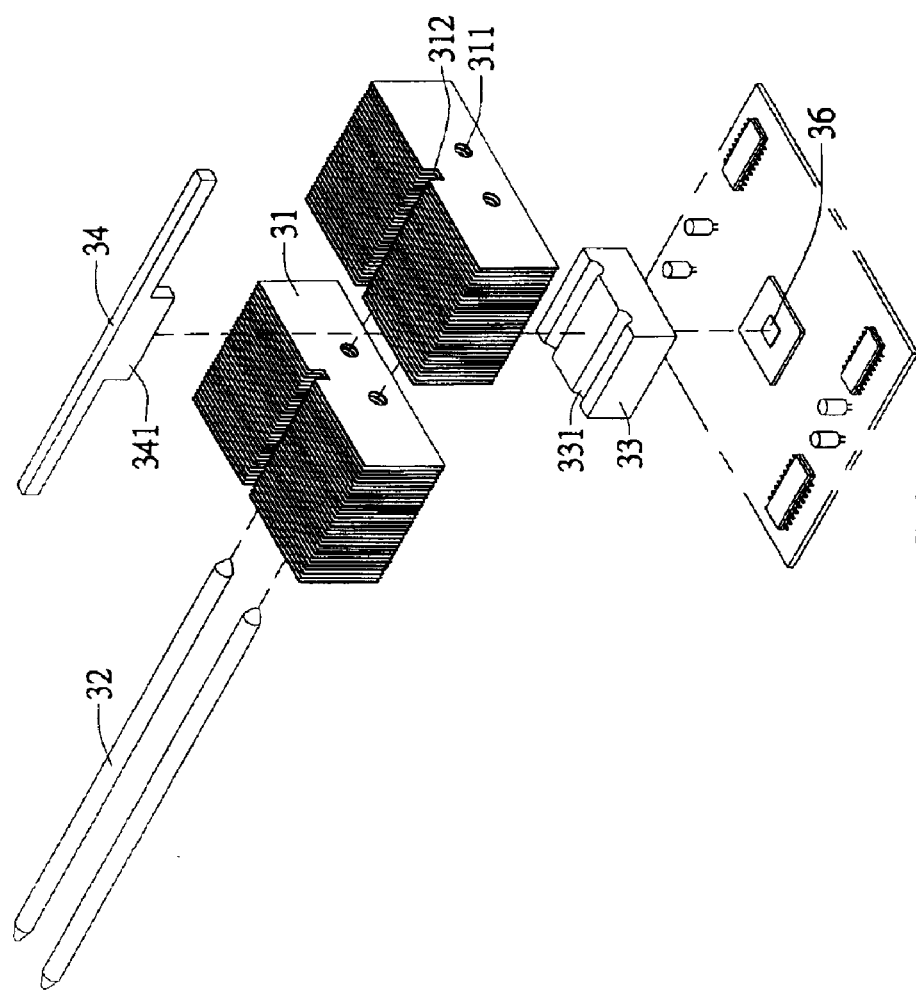
FIG. 5 is an exploded perspective view of the double-winged radiator for CPU according to the first embodiment of the present invention being further provided with a locating member.
FIG. 6 is an assembled perspective view of FIG. 5.

Please refer to FIGS. 5 and 6 that are exploded and assembled perspective views, respectively, of a variant of the double-winged radiator for CPU according to the first embodiment of the present invention. As shown, the two sets of first radiator fins 31 are provided on a top at corresponding positions with two recess portions 312 for a locating member 34 to seat therein.

The locating member 34 includes a projection 341 downward extended from a lower middle portion thereof. When the locating member 34 is seated in the recess portions 312 on the top of the first radiator fins 31, the projection 341 is located between the two sets of first radiator fins 31 with two ends thereof separately abutted on two inner sides of the two sets of first radiator fins 31, protecting the first radiator fins 31 against deformation due to a force applied thereto by fastening means (not shown) mounted onto the first radiator fins 31. The locating member 34 with the projection 341 also protects the heat-transfer tubes 32 against bending or deformation due to the force applied thereto by the fastening means mounted onto the first radiator fins 31.

Figure 8:
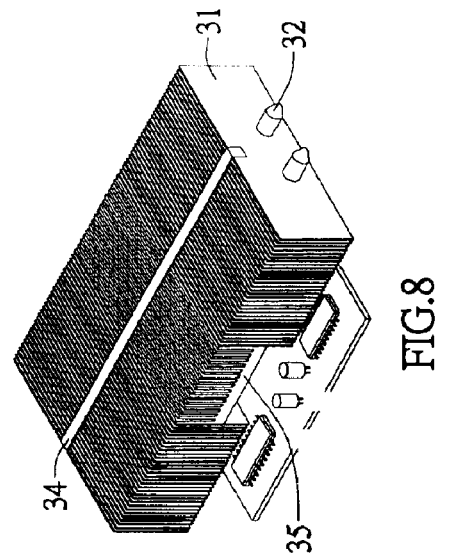
FIG. 8 is an assembled perspective view of FIG. 7.
Figure 7:
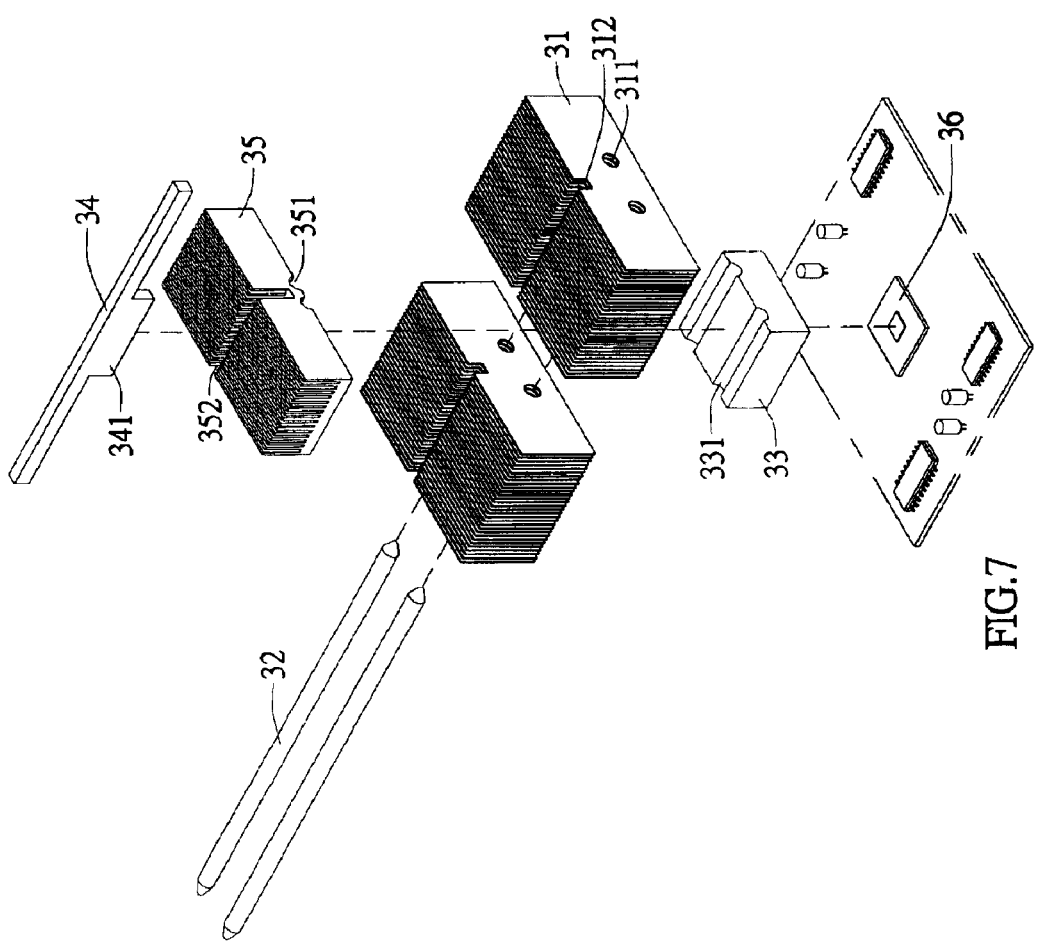
FIG. 7 is an exploded perspective view of the double-winged radiator for CPU according to the first embodiment of the present invention being further provided with a locating member and a set of second radiator fins.

FIGS. 7 and 8 illustrate a further variant of the double-winged radiator for CPU according to the first embodiment of the present invention. As shown, in addition to the locating member 34, one set of second radiator fins 35 is further provided for positioning between the two sets of first radiator fins 31 and above the heat-transfer block 33. The set of second radiator fins 35 is provided at a lower side with an engaging portion 351 corresponding to the two heat-transfer tubes 32, and at a top with a recess portion 352 corresponding to the projection 341 of the locating member 34. When the set of second radiator fins 35 is positioned on the two heat-transfer tubes 32 between the two sets of first radiator fins 31, the lower side of the second radiator fins 35 is in contact with the top of the heat-transfer block 33 to increase the radiating area and efficiency of the radiator of the present invention. The locating member 34 is mounted onto the radiator fins with its two outer ends seated in the recess portions 312 on the top of the two sets of first radiator fins 31 and the projection 341 in the recess portion 352 on the top of the set of second radiator fins 35, keeping the set of second radiator fins 35 and the two sets of first radiator fins 31 in a serially connected state.

Figures 9, 10:
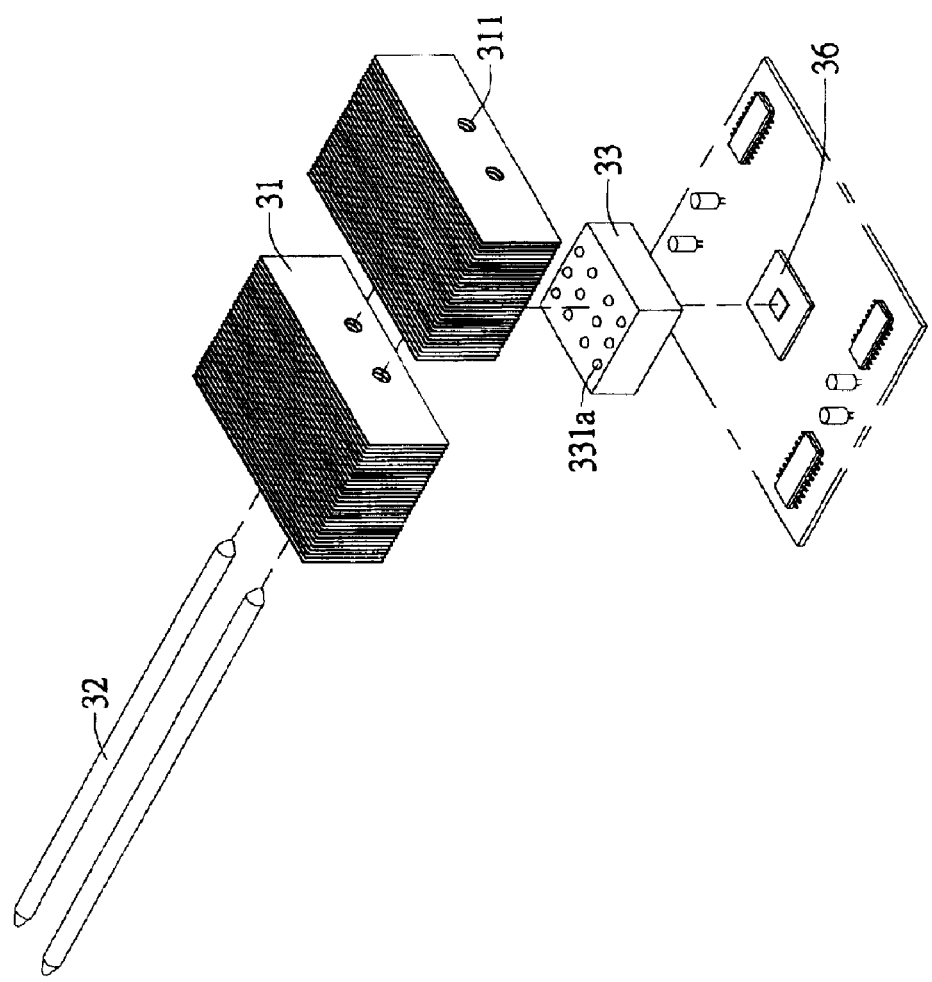
FIG. 9 is an exploded perspective view of a double-winged radiator for CPU according to a second embodiment of the present invention.
FIG. 10 is an assembled perspective view of FIG. 9.

Please refer to FIGS. 9 and 10 that are exploded and assembled perspective views, respectively, of a double-winged radiator for CPU according to a second embodiment of the present invention. As shown, the double-winged radiator for CPU of the second embodiment is generally structurally similar to the first embodiment, except that the heat-transfer block 33 is provided on a top thereof with a receiving portion 331 that includes two pairs of spaced rows of protuberances 331a instead of two grooves. The space between two rows of protuberances 331a in one pair is adapted to receive one heat-transfer tube 32 therein.

The present invention has been described with some preferred embodiments thereof and it is understood that many changes and modifications in the described embodiments can be carried out without departing from the scope and the spirit of the invention as defined by the appended claims.

What is claimed is:

1. A double-winged radiator for CPU, comprising:

two sets of first radiator fins being made of a material having a high heat transfer capacity, and provided at a predetermined position with at least one through hole;

at least one heat-transfer tube extended through said at least one through hole provided on said two sets of first radiator fins, so that said two sets of first radiator fins are separately fixedly located at two outer ends of said at least one heat-transfer tube; and a heat-transfer block being made of a material having a high heat transfer capacity, and provided at a top with a receiving portion, in which a section of said at least one heat-transfer tube between said two sets of first radiator fins is seated; and said heat-transfer block being mounted on an upper side of a central processing unit (CPU) to transfer heat produced by said CPU during an operation thereof via said at least one heat-transfer tube to said two sets of first radiator fins that provide a large radiating area and therefore enable heat transferred thereto to quickly dissipate therefrom;

further comprising a locating member having a projection downward extended from a lower middle portion thereof, and a recess portion being provided on a top of each of said two sets of first radiator fins for receiving two outer ends of said locating member while said downward extended projection of said locating member is located between said two sets of first radiator fins.

2. The double-winged radiator for CPU as claimed in claim 1, wherein said heat-transfer tube is more than one in number.

3. The double-winged radiator for CPU as claimed in claim 1, wherein said heat-transfer block is preferably made of a copper material.

4. The double-winged radiator for CPU as claimed in claim 1, further comprising one set of second radiator fins located between said two sets of first radiator fins, said set of second radiator fins being provided at a lower side with an engaging portion for engaging with said at least one heat-transfer tube, so as to provide increased radiating area and radiating efficiency for said double-winged radiator for CPU.

5. The double-winged radiator for CPU as claimed in claim 1, wherein said receiving portion on the top of said heat-transfer block comprises at least one groove corresponding to and receiving said at least one heat-transfer tube therein.

6. The double-winged radiator for CPU as claimed in claim 1, wherein said receiving portion on the top of said heat-transfer block comprises at least one pair of two rows of protuberances, and a distance between said two rows of protuberance corresponding to said at least one heat-transfer tube for receiving said heat-transfer tube therein.

* * * * *